United States Patent
Yang et al.

(10) Patent No.: US 11,522,063 B2
(45) Date of Patent: Dec. 6, 2022

(54) SHIELD GATE TRENCH POWER DEVICE AND METHOD FOR MAKING THE SAME

(71) Applicant: Shanghai Huahong Grace Semiconductor Manufacturing Corporation, Shanghai (CN)

(72) Inventors: Yafeng Yang, Shanghai (CN); Lei Shi, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 12 days.

(21) Appl. No.: 17/231,340

(22) Filed: Apr. 15, 2021

(65) Prior Publication Data
US 2022/0045183 A1    Feb. 10, 2022

(30) Foreign Application Priority Data
Aug. 6, 2020    (CN) .................. 202010781555.X

(51) Int. Cl.
| | | |
|---|---|---|
| *H01L 29/423* | (2006.01) | |
| *H01L 21/28* | (2006.01) | |
| *H01L 29/06* | (2006.01) | |
| *H01L 29/66* | (2006.01) | |
| *H01L 29/78* | (2006.01) | |

(52) U.S. Cl.
CPC .... *H01L 29/4236* (2013.01); *H01L 21/28194* (2013.01); *H01L 29/0696* (2013.01); *H01L 29/66734* (2013.01); *H01L 29/7813* (2013.01)

(58) Field of Classification Search
CPC ............. H01L 29/4236; H01L 29/0696; H01L 29/66734; H01L 29/7813; H01L 21/28194

USPC ......................................................... 257/330
See application file for complete search history.

(56) References Cited

U.S. PATENT DOCUMENTS

| | | | |
|---|---|---|---|
| 9,917,183 B2* | 3/2018 | Arai ...................... H01L 29/407 |
| 11,239,357 B2* | 2/2022 | Nishiwaki ......... H01L 29/66734 |
| 2013/0168760 A1* | 7/2013 | Hsieh ................ H01L 29/42376 |
| | | | 438/270 |
| 2014/0077278 A1* | 3/2014 | Nozu .................. H01L 29/7813 |
| | | | 257/773 |
| 2021/0384346 A1* | 12/2021 | Hsieh .................. H01L 29/0634 |

FOREIGN PATENT DOCUMENTS

| | | | |
|---|---|---|---|
| CN | 107910266 A | * | 4/2018 |
| CN | 107910268 A | * | 4/2018 |
| CN | 107910269 A | * | 4/2018 |

* cited by examiner

*Primary Examiner* — Igwe U Anya
(74) *Attorney, Agent, or Firm* — Murtha Cullina LLP

(57) ABSTRACT

A shield gate trench power device, wherein a shield dielectric layer is formed by stacking a thermal oxide layer and a CVD dielectric layer on the inner side surface of a gate trench; a gap region formed by means of filling with the shield dielectric layer is filled with source polysilicon; a top trench is formed on two sides of the source polysilicon by etching a portion of the shield dielectric layer close to the side surface of the gate trench, and the entire top trench is located in the thermal oxide layer; the top trench is filled with a polysilicon gate. A method for manufacturing a shield gate trench power device. The uniformity of the thickness of the shield dielectric layer on the sidewall and bottom of the gate trench can be improved.

15 Claims, 5 Drawing Sheets

US 11,522,063 B2

SHIELD GATE TRENCH POWER DEVICE AND METHOD FOR MAKING THE SAME

CROSS-REFERENCE TO RELATED APPLICATION

This application claims the priority to Chinese patent application No. CN 202010781555.X filed at CNIPA on Aug. 6, 2020, entitled "SHIELD GATE TRENCH POWER DEVICE AND METHOD FOR MAKING THE SAME", the disclosure of which is incorporated herein by reference in entirety.

TECHNICAL FIELD

The present application relates to the field of semiconductor integrated circuit manufacturing, in particular to a shield gate trench (SGT) gate power device. The present application further relates to a method for manufacturing a shield gate trench power device.

BACKGROUND

FIG. 1A is a photo of a top structure of an existing shield gate trench (SGT) power device; and FIG. 1B is a photo of the bottom of a gate structure of the shield gate trench power device corresponding to FIG. 1A. The gate structure of a device cell region of the existing shield gate trench power device includes the following:

A gate trench 102 is formed in an epitaxial layer 101.

A shield dielectric layer 103 is formed on the bottom surface and side surface of the gate trench 102; and the shield dielectric layer 103 is composed of a thermal oxide layer.

The shield dielectric layer 103 does not fully fill the gate trench 102, a gap region is formed in a central region of the gate trench 102, and the gap region is filled with source polysilicon 104.

A top trench is formed on two sides of the source polysilicon 104 by means of isotropic etching of the shield dielectric layer 103.

A gate oxide layer 105 is formed on a first side surface of the top trench, i.e., an exposed side surface of the gate trench 102. The gate oxide layer 105 is generally formed by means of a thermal oxidation process, and an inter-polysilicon oxide layer 106 is formed at the same time when the gate oxide layer 105 is formed. Due to the characteristic of the source polysilicon 104 having an oxidation rate greater than the oxidation rate of the epitaxial layer 101, the thickness of the inter-polysilicon oxide layer 106 is greater than the thickness of the gate oxide layer 105.

A polysilicon gate 107 fully filling the top trench is formed in the top trench where the gate oxide layer 105 is formed.

A body region is formed on the surface of the epitaxial layer 101 between the gate structures, and a heavily doped source region is formed on the surface of the body region.

An interlayer film 108 and a contact passing through the interlayer film 108 are further formed. An opening 109 of the contact is shown in FIG. 1A, and the opening 109 in FIG. 1A exposes the surface of the bottom source region.

The structure shown in FIG. 1A is a left/right (L/R) SGT device. For the L/R SGT device having a working voltage greater than or equal to 150 V in the prior art, due to limitations on the general process, the thickness of the thermal oxide layer of the shield dielectric layer 103 is generally 6500 Å-7500 Å. Due to limitations on the thermal oxidation process, the thickness of the shield dielectric layer 103 cannot be increased, and the thickness of the shield dielectric layer 103 on the sidewall and bottom of the trench 102 is non-uniform, so the breakdown voltage of the device cannot be effectively improved by increasing the thickness of the shield dielectric layer 103. In this case, in order to improve the breakdown voltage of the device, the doping concentration of the epitaxial layer 101 needs to be reduced, resulting in an increase in the on-resistance of the device.

In addition, it can be seen from FIG. 1B that, due to characteristics of the thermal oxidation process, the thickness of the shield dielectric layer 103 is non-uniform, wherein the thickness of the shield dielectric layer 103 close to the bottom of the gate trench 102 is smaller, further reducing the performance of the device.

FIG. 2 is a photo of the existing shield gate trench power device of an improved structure in which a shield dielectric layer in a polysilicon gate formation region is etched. A gate structure includes the following:

A gate trench 202 is formed in an epitaxial layer 201, and a shield dielectric layer 203 is formed on the inner side surface of the gate trench 202. In order to overcome the problem of the limitation on the thickness of the shield dielectric layer 203 in the existing structure of FIGS. 1A and 1B, the shield dielectric layer 203 in FIG. 2 adopts a stack structure of a thermal oxide layer and an oxide layer deposited by CVD.

Then, the gate trench 202 is filled with source polysilicon 204.

It can be seen that, after isotropic etching is performed on the shield dielectric layer 203 of FIG. 2 to form a top trench 205, the depth of the top trench 205 is non-uniform, resulting from the inconsistent in etching rates of the isotropic wet etching on the thermal oxide layer and the oxide layer deposited by CVD of the shield dielectric layer 203. The etching rate of the oxide layer deposited by CVD is faster, resulting in a lower tip structure 206 at the bottom of the top trench 205. The lower tip structure 206 finally increases the gate-source capacitance Cgs of the device, because the shield dielectric layer in the lower tip structure 206 has a thinner thickness and fills the polysilicon gate, thereby increasing an overlap area between the polysilicon gate and the source polysilicon 204. These two factors cause Cgs to increase.

BRIEF SUMMARY

The technical problem to be solved by the present application is to provide a shield gate trench power device, to increase the thickness of a shield dielectric layer and improve the uniformity of the thickness of the shield dielectric layer, thereby increasing the breakdown voltage of the device while reducing the on-resistance of the device, and reducing the gate-source capacitance of the device. In view of this, the present application further provides a method for manufacturing a shield gate trench power device.

In order to solve the above technical problem, a gate structure of a device cell region of the shield gate trench power device provided by the present application comprises a doped epitaxial layer of a first conductivity type formed on a semiconductor substrate, wherein a gate trench is formed in the epitaxial layer; a shield dielectric layer formed on the bottom surface and side surface of the gate trench, wherein the shield dielectric layer is formed by stacking a thermal oxide layer and a CVD dielectric layer, such that the thickness of the shield dielectric layer is increased, and in particular, the uniformity of the thickness of the shield dielectric layer on the sidewall and bottom of the gate trench is improved, thereby increasing the breakdown voltage of the shield dielectric layer and lowering a breakdown voltage requirement of the epitaxial layer; a gap region formed in a central region of the gate trench, resulting from the shield dielectric layer not fully filling the gate trench, wherein the gap region is filled with source polysilicon; a top trench formed on two sides of the source polysilicon by performing anisotropic etching on a partial region of the shield dielectric layer close to the side surface of the gate trench, wherein the entire top trench is located in the thermal oxide layer, a first side surface of the top trench is an exposed side surface of the gate trench, the shield dielectric layer between a second side surface of the top trench and the source polysilicon serves as an inter-polysilicon dielectric layer, in the width direction of the inter-polysilicon dielectric layer, the inter-polysilicon dielectric layer is a stack structure of the CVD dielectric layer and the thermal oxide layer of a partial thickness, the width of the top trench and the width of the inter-polysilicon dielectric layer are defined by means of a photolithography at the same time, and the width of the inter-polysilicon dielectric layer is increased to increase Cgs of the device; and a gate dielectric layer formed on the first side surface of the top trench, wherein a polysilicon gate fully filling the top trench is formed in the top trench where the gate dielectric layer is formed.

In a further improvement, the semiconductor substrate comprises a silicon substrate, and the epitaxial layer is a silicon epitaxial layer.

In a further improvement, the CVD dielectric layer is an oxide layer deposited by a CVD process, and the gate dielectric layer is a gate oxide layer.

In a further improvement, a working voltage of the shield gate trench power device is greater than or equal to 150 V.

In a further improvement, the shield gate trench power device is a shield gate trench power MOSFET device, and the structure of the device cell region further comprises a doped body region of a second conductivity type formed on the surface of the epitaxial layer, wherein the top trench passes through the body region, and the surface of the body region covered by a side surface of the polysilicon gate is used to form a channel; and a heavily doped source region of the first conductivity type formed on the surface of the body region.

The semiconductor substrate has a heavily doped structure of the first conductivity type, and a drain region is formed on the back of the thinned semiconductor substrate.

In a further improvement, the shield gate trench power device further comprises a gate lead-out region; the gate lead-out region is located outside the device cell region, the gate lead-out region also comprises the gate structure, the gate structure in the gate lead-out region and the gate structure in the device cell region are formed at the same time, and the polysilicon gate in the gate lead-out region is in contact with the polysilicon gate in the device cell region.

A contact is formed on the top of the polysilicon gate of the gate structure in the gate lead-out region, and the contact on the top of the polysilicon gate is connected to a gate composed of a front metal layer.

The shield gate trench power device further comprises a source polysilicon lead-out region, the gate trench is also formed in the source polysilicon lead-out region, the shield dielectric layer and the source polysilicon are formed in the gate trench of the source polysilicon lead-out region, the top trench, the gate dielectric layer, and the polysilicon gate are not formed in the gate trench of the source polysilicon lead-out region; the source polysilicon in the source polysilicon lead-out region is in contact with the source polysilicon in the device cell region; and a contact is formed on the top of the source polysilicon in the source polysilicon lead-out region and is connected to a source composed of the front metal layer.

A contact is further formed on the top of the source region and is connected to the source.

In a further improvement, in the shield dielectric layer, the thickness of the thermal oxide layer is 3000 Å-7500 Å; and the thickness of the CVD dielectric layer is 2500 Å-7000 Å.

In a further improvement, the shield gate trench power device is an N-type device, the first conductivity type is N-type, and the second conductivity type is P-type; or the shield gate trench power device is a P-type device, the first conductivity type is P-type, and the second conductivity type is N-type.

In order to solve the above technical problem, in the method for manufacturing a shield gate trench power device provided by the present application, a gate structure of a device cell region is formed by means of the following steps: step 1. providing a semiconductor substrate, wherein a doped epitaxial layer of a first conductivity type is formed on the semiconductor substrate, and a gate trench is formed in the epitaxial layer; step 2. forming a shield dielectric layer on the bottom surface and side surface of the gate trench; wherein the shield dielectric layer comprises a thermal oxide layer formed by means of a thermal oxidation process and a CVD dielectric layer formed by means of a CVD deposition process, a stack structure of the thermal oxide layer and the CVD dielectric layer increases the thickness of the shield dielectric layer while ensuring the uniformity of the thickness of the shield dielectric layer on the sidewall and bottom of the gate trench, thereby increasing the breakdown voltage of the shield dielectric layer and lowering a breakdown voltage requirement of the epitaxial layer; and a gap region is formed in a central region of the gate trench, resulting from the shield dielectric layer not fully filling the gate trench; step 3. performing polysilicon growth and etch-back processes to fill the gap region of the gate trench with source polysilicon; step 4. performing a photolithography process to open a formation region of a top trench, wherein the formation region of the top trench corresponds to a partial region of the shield dielectric layer close to the side surface of the gate trench, anisotropic etching is performed on the shield dielectric layer of the opened region to form the top trench, the entire top trench is located in the thermal oxide layer, a first side surface of the top trench is an exposed side surface of the gate trench, the shield dielectric layer between a second side surface of the top trench and the source polysilicon serves as an inter-polysilicon dielectric layer, in the width direction of the inter-polysilicon dielectric layer, the inter-polysilicon dielectric layer is a stack structure of the CVD dielectric layer and the thermal oxide layer of a partial thickness, the width of the top trench and the width of the inter-polysilicon dielectric layer are defined by means of photolithography at the same time, and the width of the inter-polysilicon dielectric layer is increased to increase Cgs of the device; and step 5. forming a gate dielectric layer on the first side surface of the top trench and performing polysilicon growth and etch-back processes to fill the top trench where the gate dielectric layer is formed with polysilicon and form a polysilicon gate.

In a further improvement, the semiconductor substrate comprises a silicon substrate, and the epitaxial layer is a silicon epitaxial layer.

In a further improvement, the CVD dielectric layer is an oxide layer deposited by a CVD process, and the gate dielectric layer is a gate oxide layer.

In a further improvement, a working voltage of the shield gate trench power device is greater than or equal to 150 V.

In a further improvement, the shield gate trench power device is a shield gate trench power MOSFET device, and the method further comprises the following steps of a frontside process forming a doped body region of a second conductivity type on the surface of the epitaxial layer, wherein the top trench passes through the body region, and the surface of the body region covered by a side surface of the polysilicon gate is used to form a channel; and forming a heavily doped source region of the first conductivity type on the surface of the body region of the device cell region.

The semiconductor substrate has a heavily doped structure of the first conductivity type, and after the frontside process is completed, the method further comprises the following backside process: thinning the semiconductor substrate; and forming a drain region by the thinned semiconductor substrate; or performing doping on the back of the thinned semiconductor substrate to form a heavily doped drain region of the first conductivity type.

In a further improvement, the shield gate trench power device further comprises a gate lead-out region; the gate lead-out region is located outside the device cell region, the gate lead-out region also comprises the gate structure, the gate structure in the gate lead-out region and the gate structure in the device cell region are formed at the same time, and the polysilicon gate in the gate lead-out region is in contact with the polysilicon gate in the device cell region.

The shield gate trench power device further comprises a source polysilicon lead-out region, the gate trench is also formed in the source polysilicon lead-out region, the shield dielectric layer and the source polysilicon are formed in the gate trench of the source polysilicon lead-out region, the top trench, the gate dielectric layer, and the polysilicon gate are not formed in the gate trench of the source polysilicon lead-out region; and the source polysilicon in the source polysilicon lead-out region is in contact with the source polysilicon in the device cell region.

The frontside process further comprises steps of forming an interlayer film, a contact, and a front metal layer, and patterning the front metal layer to form a gate and a source.

A contact is formed on the top of the polysilicon gate of the gate structure in the gate lead-out region, and the contact on the top of the polysilicon gate is connected to the gate.

A contact is formed on the top of the source polysilicon in the source polysilicon lead-out region and is connected to the source.

A contact is further formed on the top of the source region and is connected to the source.

In a further improvement, in the shield dielectric layer, the thickness of the thermal oxide layer is 3000 Å-7500 Å; and the thickness of the CVD dielectric layer is 2500 Å-7000 Å.

In the present application, the gate structure of the device cell region of the shield gate trench power device is a left/right structure, and the shield dielectric layer adopts the stack structure of the thermal oxide layer and the CVD dielectric layer, to increase the thickness of the shield dielectric layer while the uniformity of the thickness of the shield dielectric layer on the sidewall and bottom of the gate trench is ensured, thereby increasing the breakdown voltage of the shield dielectric layer and lowering the breakdown voltage requirement of the epitaxial layer. In this case, the doping concentration of the epitaxial layer can be improved. Since the on-resistance of the device is smaller when the doping concentration of the epitaxial layer is higher, in the present application, the on-resistance of the device can be reduced in the condition that the breakdown voltage of the device is increased or the breakdown voltage of the device remains unchanged.

Additionally, in the present application, the top trench used to form the polysilicon gate is defined by means of a photolithography process, then the top trench is formed by means of anisotropic etching, and the entire top trench is located in the thermal oxide layer, so as to avoid the defects of the non-uniformity of the depth of the top trench and the non-uniformity of the thickness of the inter-polysilicon dielectric layer which result from an etching rate of the CVD dielectric layer greater than an etching rate of the thermal oxide layer, in the case where the CVD dielectric layer is introduced to thicken the shield dielectric layer. The thickness of the inter-polysilicon dielectric layer can be controlled accurately and be increased, and the depth of the polysilicon gate covering the side surface of the inter-polysilicon dielectric layer can be fixed and reduced. Therefore, in the present application, Cgs, i.e., the gate-source capacitance, of the device can be reduced.

In addition, the shield dielectric layer of the present application adopts the stack structure of the thermal oxide layer and the CVD dielectric layer, to eliminate the defect of the non-uniformity of the thickness of the shield dielectric layer in the case where only the thermal oxide layer is used, and finally improve the uniformity of the thickness of the shield dielectric layer.

Although in the prior art, the top trench is formed by means of anisotropic etching, a photolithography process is still required to form the gate and source lead-out regions outside the device cell region. Therefore, the photolithography process of the top trench in the present application does not increase the process cost.

BRIEF DESCRIPTION OF THE DRAWINGS

The present application is further described in detail below with reference to the drawings and specific implementations.

DETAILED DESCRIPTION OF THE DISCLOSURE

Figure 1A:
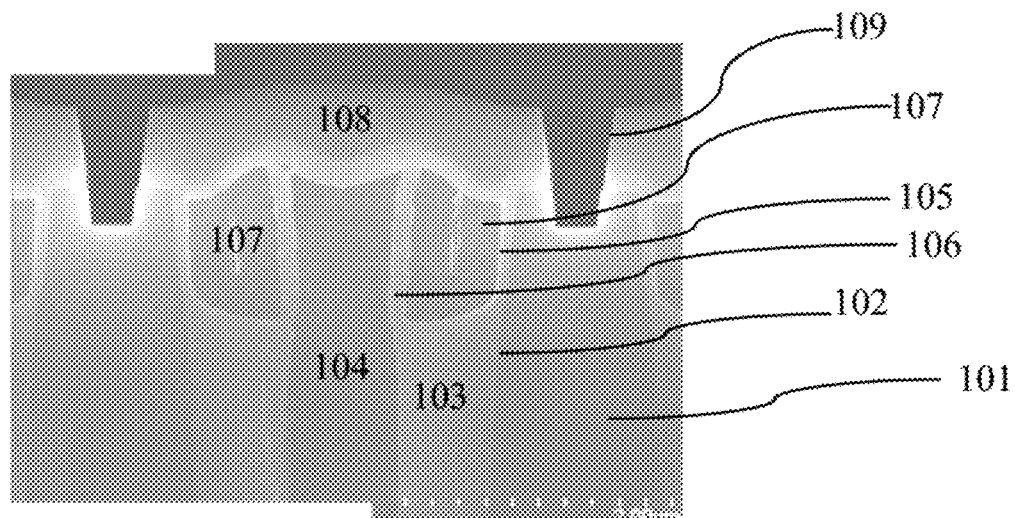
FIG. 1A is a photo of a top structure of an existing shield gate trench power device.
Figure 1B:
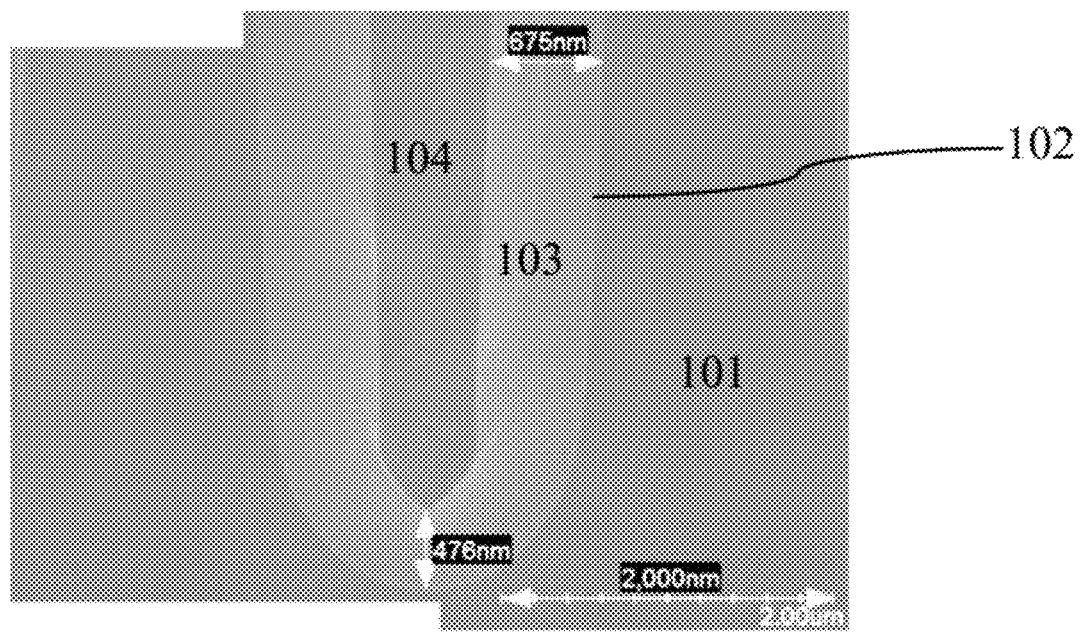
FIG. 1B is a photo of the bottom of a gate structure of the shield gate trench power device corresponding to FIG. 1A.
Figure 2:
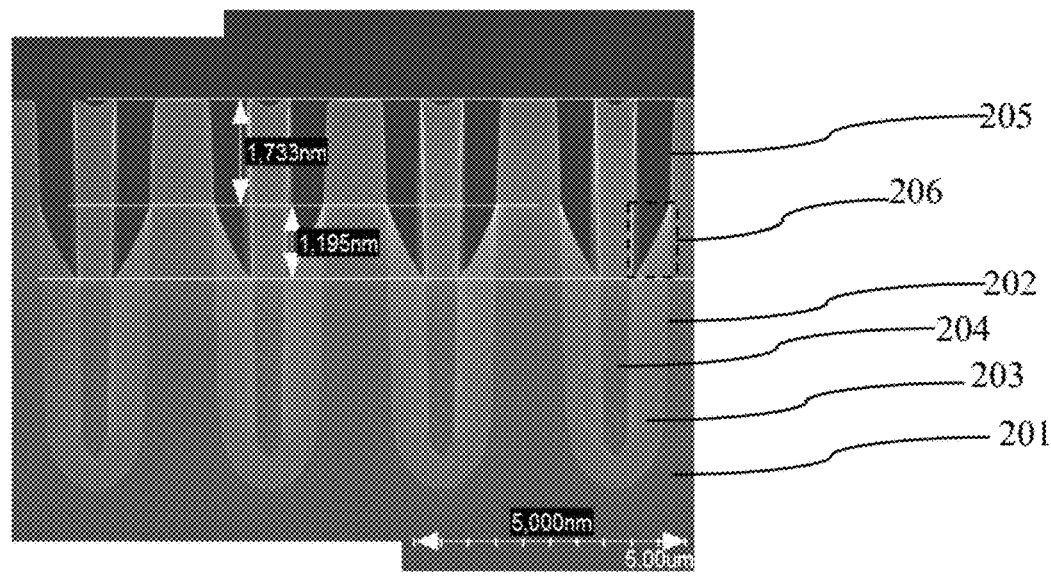
FIG. 2 is a photo of the existing shield gate trench power device of an improved structure in which a shield dielectric layer in a polysilicon gate formation region is etched.
Figure 3:
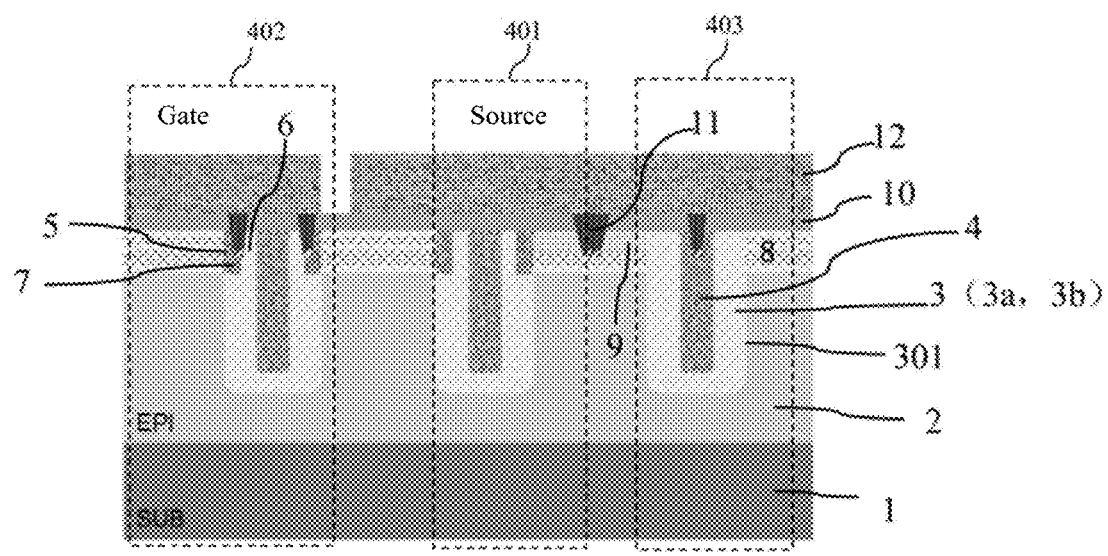
FIG. 3 is a schematic structural diagram of a shield gate trench power device according to an embodiment of the present application.

FIG. 3 is a schematic structural diagram of a shield gate trench power device according to an embodiment of the present application. Only one gate structure is shown in a device cell region 401 in FIG. 3, but in practice, the device cell region 401 includes a plurality of device cell and each device cell is provided with a gate structure. The gate structure of the device cell region 401 of the shield gate trench power device according to the embodiment of the present application includes the following:

A doped epitaxial layer 2 of a first conductivity type is formed on a semiconductor substrate 1, and a gate trench 301 is formed in the epitaxial layer 2. In FIG. 3, the semiconductor substrate 1 is represented by SUB, and the epitaxial layer 2 is represented by EPI.

In the embodiment of the present application, the semiconductor substrate 1 includes a silicon substrate, and the epitaxial layer 2 is a silicon epitaxial layer 2.

A shield dielectric layer 3 is formed on the bottom surface and side surface of the gate trench 301. The shield dielectric layer 3 is formed by stacking a thermal oxide layer 3a and a CVD dielectric layer 3b, such that the thickness of the shield dielectric layer 3 is increased while the uniformity of the thickness of the shield dielectric layer 3 on the sidewall and bottom of the gate trench 301 is ensured, thereby increasing the breakdown voltage of the shield dielectric layer 3 and lowering a breakdown voltage requirement of the epitaxial layer 2.

In the embodiment of the present application, the CVD dielectric layer 3b is an oxide layer deposited by a CVD process.

A gap region is formed in a central region of the gate trench 301, resulting from the shield dielectric layer 3 not fully filling the gate trench 301, and the gap region is filled with source polysilicon 4.

A top trench 304 (refer to FIG. 5C) is formed on two sides of the source polysilicon 4 by etching a partial region of the shield dielectric layer 3 close to the side surface of the gate trench 301, and the entire top trench 304 is located in the thermal oxide layer 3a. A first side surface of the top trench 304 is an exposed side surface of the gate trench 301, the shield dielectric layer 3 between a second side surface of the top trench 304 and the source polysilicon 4 serves as an inter-polysilicon dielectric layer 6, in the width direction of the inter-polysilicon dielectric layer 6, the inter-polysilicon dielectric layer 6 is a stack structure of the CVD dielectric layer 3b and the thermal oxide layer 3a of a partial thickness, the width of the top trench 304 and the width of the inter-polysilicon dielectric layer 6 are defined by means of photolithography at the same time, and the width of the inter-polysilicon dielectric layer 6 is increased to increase Cgs of the device.

A gate dielectric layer 5 is formed on the first side surface of the top trench 304, a polysilicon gate 7 fully filling the top trench 304 is formed in the top trench 304 where the gate dielectric layer 5 is formed.

In the embodiment of the present application, the gate dielectric layer 5 is a gate oxide layer.

A working voltage of the shield gate trench power device is greater than or equal to 150 V.

The thickness of the thermal oxide layer 3a is 3000 Å-7500 Å; and the thickness of the CVD dielectric layer 3b is 2500 Å-7000 Å.

The shield gate trench power device is a shield gate trench power MOSFET device, and the structure of the device cell region 401 further includes the following:

A doped body region 8 of a second conductivity type is formed on the surface of the epitaxial layer 2, the top trench 304 passes through the body region 8, and the surface of the body region 8 covered by a side surface of the polysilicon gate 7 is used to form a channel.

A heavily doped source region 9 of the first conductivity type is formed on the surface of the body region 8.

The semiconductor substrate 1 has a heavily doped structure of the first conductivity type, and a drain region is formed on the back of the thinned semiconductor substrate 1.

The shield gate trench power device further includes a gate lead-out region 402. The gate lead-out region 402 is located outside the device cell region 401, the gate lead-out region 402 also includes the gate structure, the gate structure in the gate lead-out region 402 and the gate structure in the device cell region 401 are formed at the same time, and the polysilicon gate 7 in the gate lead-out region 402 is in contact with the polysilicon gate 7 in the device cell region 401.

A contact 11 is formed on the top of the polysilicon gate 7 of the gate structure in the gate lead-out region 402, and the contact 11 on the top of the polysilicon gate 7 is connected to a gate composed of a front metal layer 12.

The shield gate trench power device further includes a source polysilicon lead-out region 403, the gate trench 301 is also formed in the source polysilicon lead-out region 403, the shield dielectric layer 3 and the source polysilicon 4 are formed in the gate trench 301 of the source polysilicon lead-out region 403, the top trench 304, the gate dielectric layer 5, and the polysilicon gate 7 are not formed in the gate trench 301 of the source polysilicon lead-out region 403. The source polysilicon 4 in the source polysilicon lead-out region 403 is in contact with the source polysilicon 4 in the device cell region 401. A contact 11 is formed on the top of the source polysilicon 4 in the source polysilicon lead-out region 403 and is connected to a source composed of the front metal layer 12.

A contact 11 is further formed on the top of the source region 9 and is connected to the source.

In the embodiment of the present application, the shield gate trench power device is an N-type device, the first conductivity type is N-type, and the second conductivity type is P-type. In other embodiment of the present application, the shield gate trench power device is a P-type device, the first conductivity type is P-type, and the second conductivity type is N-type.

In the embodiment of the present application, the gate structure of the device cell region 401 of the shield gate trench power device is a left/right structure, and the shield dielectric layer 3 adopts the stack structure of the thermal oxide layer 3a and the CVD dielectric layer 3b, to increase the thickness of the shield dielectric layer 3 while the uniformity of the thickness of the shield dielectric layer 3 on the sidewall and bottom of the gate trench is ensured, thereby increasing the breakdown voltage of the shield dielectric layer 3 and lowering the breakdown voltage requirement of the epitaxial layer 2. In this case, the doping concentration of the epitaxial layer 2 can be improved. Since the on-resistance of the device is smaller when the doping concentration of the epitaxial layer 2 is higher, in the embodiment of the present application, the on-resistance of the device can be reduced in the condition that the breakdown voltage of the device is increased, or the breakdown voltage of the device remains unchanged.

Additionally, in the embodiment of the present application, the top trench 304 used to form the polysilicon gate 7 is defined by means of a photolithography process, then anisotropic etching is performed, and the entire top trench 304 is located in the thermal oxide layer 3a, so as to avoid the defects of the non-uniformity of the depth of the top trench 304 and the non-uniformity of the thickness of the inter-polysilicon dielectric layer 6 which result from an etching rate of the CVD dielectric layer 3b greater than an etching rate of the thermal oxide layer 3a, in the case where the CVD dielectric layer 3b is introduced to thicken the shield dielectric layer 3. The thickness of the inter-polysilicon dielectric layer 6 can be controlled accurately and be increased, and the depth of the polysilicon gate 7 covering the side surface of the inter-polysilicon dielectric layer 6 can be fixed and reduced. Therefore, Cgs, i.e., the gate-source capacitance, of the device can be reduced.

In addition, the shield dielectric layer 3 of the embodiment of the present application adopts the stack structure of the thermal oxide layer 3a and the CVD dielectric layer 3b, to eliminate the defect of the non-uniformity of the thickness of the shield dielectric layer 3 in the case where only the thermal oxide layer 3a is used, and finally improve the uniformity of the thickness of the shield dielectric layer 3.

Although in the prior art, the top trench 304 is formed by means of anisotropic etching, a photolithography process is still required to form the lead-out regions outside the device cell region. Therefore, the photolithography process of the top trench 304 in the embodiment of the present application does not increase the process cost.

Figure 4A:
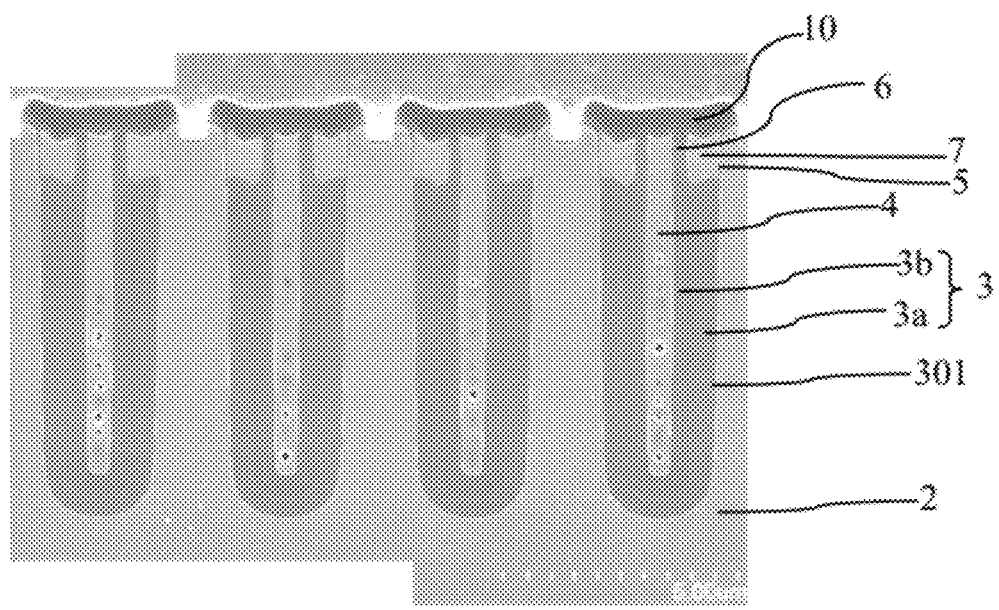
FIG. 4A is a photo of the shield gate trench power device according to the embodiment of the present application.

FIG. 4A is a photo of the shield gate trench power device according to the embodiment of the present application. It can be seen that, in the embodiment of the present application, the thickness of the inter-polysilicon dielectric layer 6 is accurately controlled, that is, there is good uniformity in the thickness, and the inter-polysilicon dielectric layer 6 finally can be thickened; and the area of the side surface of the inter-polysilicon dielectric layer 6 covered by the polysilicon gate 7 is not increased, both cases facilitating a reduction in Cgs of the device.

Figure 4B:
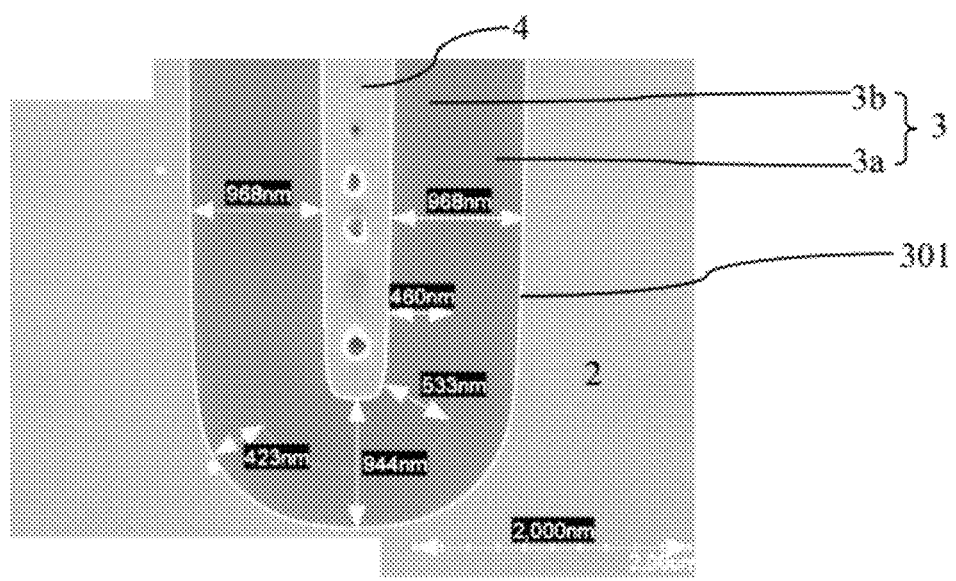
FIG. 4B is a photo of the bottom of a gate structure of the shield gate trench power device according to the embodiment of the present application.

FIG. 4B is a photo of the bottom of the gate structure of the shield gate trench power device according to the embodiment of the present application. The thickness at each position on the shield dielectric layer 3 is marked in FIG. 4B. Although the thermal oxide layer 3a at the bottom of the gate trench 301 is relatively thin, by stacking the thermal oxide layer 3a and the CVD dielectric layer 3b, the uniformity of the thickness at each position on the shield dielectric layer 3 can be improved.

FIGS. 5A-5D are schematic diagrams of device structures in steps of a method for manufacturing a shield gate trench power device according to an embodiment of the present application. In the method for manufacturing a shield gate trench power device according to the embodiment of the present application, a gate structure of a device cell region 401 is formed by means of the following steps.

Figure 5A:
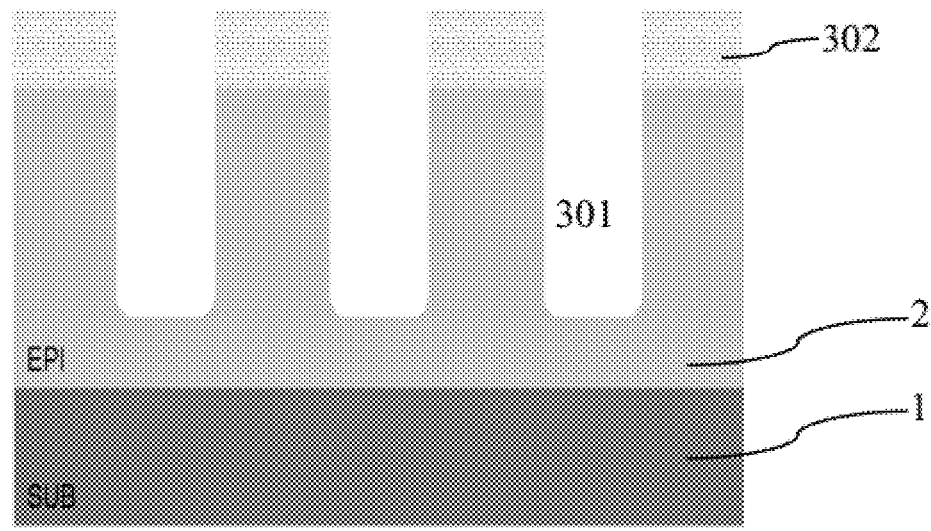
FIGS. 5A-5D are schematic diagrams of device structures in steps of a method for manufacturing a shield gate trench power device according to an embodiment of the present application.

Step 1. Referring to FIG. 5A, a semiconductor substrate 1 is provided, where a doped epitaxial layer 2 of a first conductivity type is formed on the semiconductor substrate 1, and a gate trench 301 is formed in the epitaxial layer 2.

In the method according to the embodiment of the present application, the semiconductor substrate 1 includes a silicon substrate, and the epitaxial layer 2 is a silicon epitaxial layer 2.

A hard mask layer 302 is used for forming the gate trench 301, and the formation includes the following sub-steps:

First, the hard mask layer 302 is formed on the surface of the epitaxial layer 2. In the method according to the embodiment of the present application, the hard mask layer 302 includes an ONO structure, and the ONO structure is a stack structure of an oxide layer, a nitride layer, and an oxide layer. In other method embodiment, the hard mask layer 302 is silicon nitride or a stack structure of silicon oxide and silicon nitride.

After photolithography definition is performed, the hard mask layer 302 and the epitaxial layer 2 are sequentially etched to form the gate trench 301.

Figure 5B:
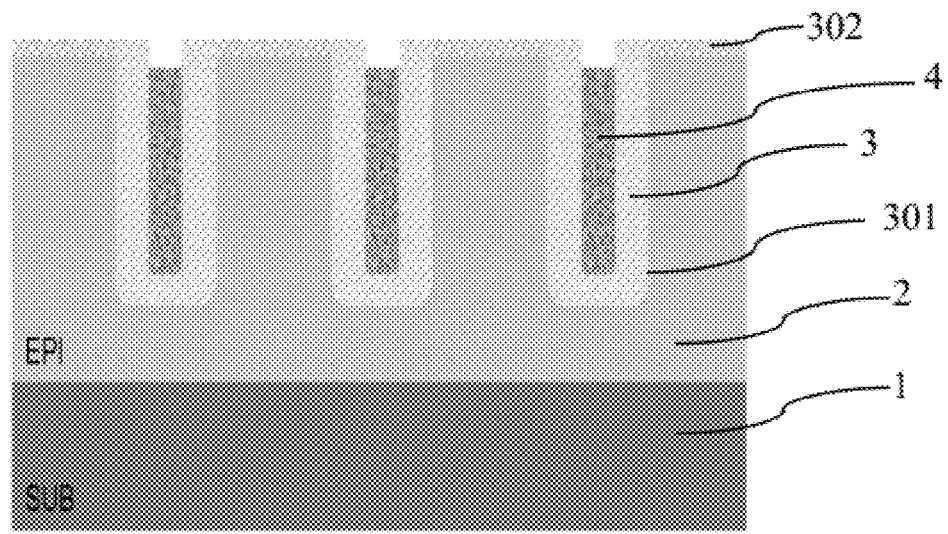

Step 2. Referring to FIG. 5B, a shield dielectric layer 3 is formed on the bottom surface and side surface of the gate trench 301.

The shield dielectric layer 3 includes a thermal oxide layer 3a formed by means of a thermal oxidation process and a CVD dielectric layer 3b formed by means of a CVD deposition process, a stack structure of the thermal oxide layer 3a and the CVD dielectric layer 3b increases the thickness of the shield dielectric layer 3 while ensuring the uniformity of the thickness of the shield dielectric layer 3 on the sidewall and bottom of the gate trench 301, thereby increasing the breakdown voltage of the shield dielectric layer 3 and lowering a breakdown voltage requirement of the epitaxial layer 2.

A gap region is formed in a central region of the gate trench 301, resulting from the shield dielectric layer 3 not fully filling the gate trench 301.

In the method according to the embodiment of the present application, the CVD dielectric layer 3b is an oxide layer deposited by a CVD process.

A working voltage of the shield gate trench power device is greater than or equal to 150 V.

In the shield dielectric layer 3, the thickness of the thermal oxide layer 3a is 3000 Å-7500 Å; and the thickness of the CVD dielectric layer 3b is 2500 Å-7000 Å.

Step 3. Referring to FIG. 5B, polysilicon growth and etch-back processes are performed to fill the gap region of the gate trench 301 with source polysilicon 4.

It can be seen from FIG. 5B that, the surface of the source polysilicon 4 is lower than the surface of the epitaxial layer 2 after etch-back, for example, the surface of the source polysilicon 4 is lower than the surface of the epitaxial layer 2 by 1000 Å.

Figure 5C:
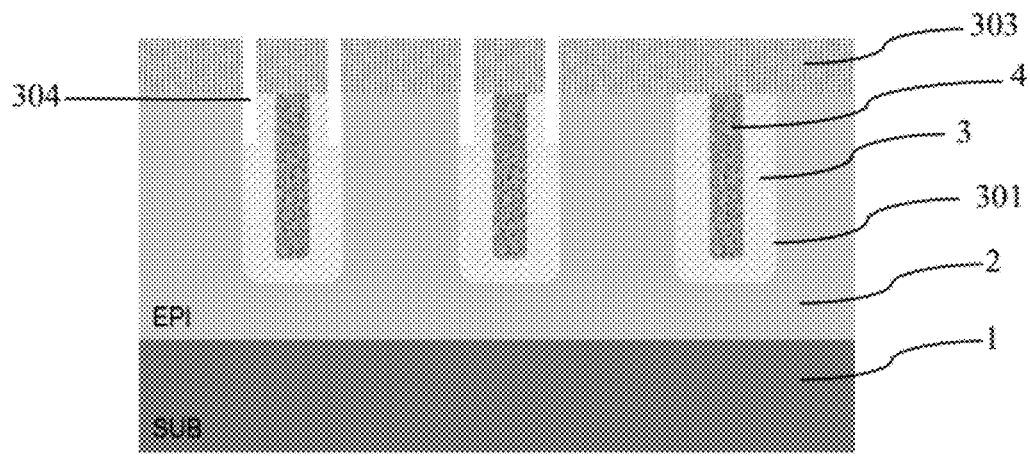

Step 4. Referring to FIG. 5C, a photolithography process is performed to form a photoresist pattern 303 and open a formation region of a top trench 304, where the formation region of the top trench 304 corresponds to a partial region of the shield dielectric layer 3 close to the side surface of the gate trench 301; anisotropic etching is performed on the shield dielectric layer 3 of the opened region to form the top trench 304; the entire top trench 304 is located in the thermal oxide layer 3a, to prevent the problem of the non-uniformity in the bottom depth of the top trench 304 caused by different etching rates of the thermal oxide layer 3a and the CVD dielectric layer 3b; a first side surface of the top trench 304 is an exposed side surface of the gate trench 301; the shield dielectric layer 3 between a second side surface of the top trench 304 and the source polysilicon 4 serves as an inter-polysilicon dielectric layer 6; in the width direction of the inter-polysilicon dielectric layer 6, the inter-polysilicon dielectric layer 6 is a stack structure of the CVD dielectric layer 3b and the thermal oxide layer 3a of a partial thickness; the width of the top trench 304 and the width of the inter-polysilicon dielectric layer 6 are defined by means of photolithography at the same time, to avoid a relatively small thickness of the inter-polysilicon dielectric layer 6 and a relatively large range of the depth of the top trench 304 covering the inter-polysilicon dielectric layer 6; and the width of the inter-polysilicon dielectric layer 6 is increased to increase Cgs of the device.

In the method according to the embodiment of the present application, before the photolithography process for defining the top trench 304, the method further includes a step of smoothing a surface dielectric layer of the epitaxial layer 2 by means of chemical vapor polishing, i.e., removing the hard mask layer 302 on the surface of the epitaxial layer 2.

Figure 5D:
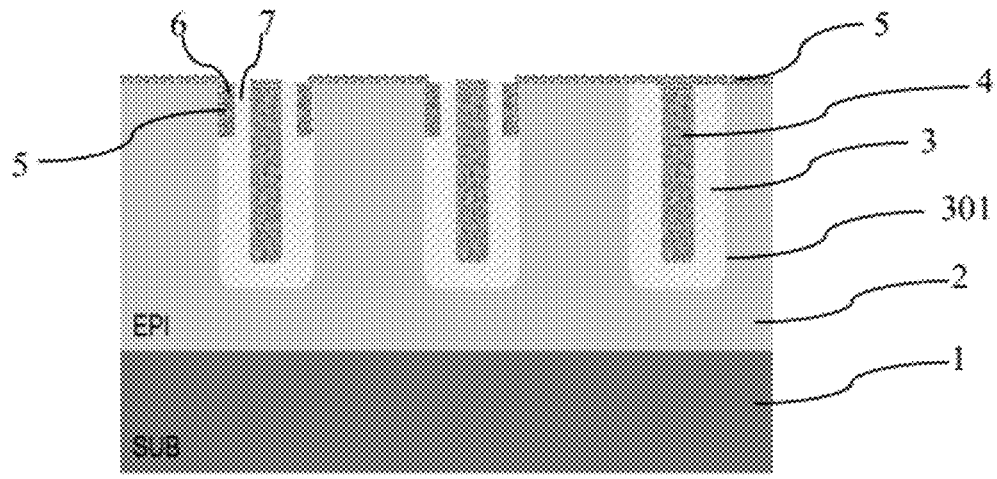

Step 5. Referring to FIG. 5D, a gate dielectric layer 5 is formed on the first side surface of the top trench 304, and polysilicon growth and etch-back processes are performed to fill the top trench 304 where the gate dielectric layer 5 is formed with polysilicon and form a polysilicon gate 7.

Referring to FIG. 3, the shield gate trench power device is a shield gate trench power MOSFET device, and the method further includes the following steps of a frontside process:

A doped body region 8 of a second conductivity type is formed on the surface of the epitaxial layer 2, where the top trench 304 passes through the body region 8, and the surface of the body region 8 covered by a side surface of the polysilicon gate 7 is used to form a channel.

A heavily doped source region 9 of the first conductivity type on the surface of the body region 8 of the device cell region 401.

The semiconductor substrate 1 has a heavily doped structure of the first conductivity type, and after the frontside process is completed, the method further includes the following backside process:

The semiconductor substrate 1 is thinned.

A drain region is formed by the thinned semiconductor substrate 1; or doping is performed on the back of the thinned semiconductor substrate 1 to form a heavily doped drain region of the first conductivity type.

In the method according to the embodiment of the present application, the shield gate trench power device further includes a gate lead-out region 402; the gate lead-out region 402 is located outside the device cell region 401, the gate lead-out region 402 also includes the gate structure, the gate structure in the gate lead-out region 402 and the gate structure in the device cell region 401 are formed at the same time, and the polysilicon gate 7 in the gate lead-out region 402 is in contact with the polysilicon gate 7 in the device cell region 401.

The shield gate trench power device further includes a source polysilicon lead-out region 403, the gate trench 301 is also formed in the source polysilicon lead-out region 403, the shield dielectric layer 3 and the source polysilicon 4 are formed in the gate trench 301 of the source polysilicon lead-out region 403, the top trench 304, the gate dielectric layer 5, and the polysilicon gate 7 are not formed in the gate trench 301 of the source polysilicon lead-out region 403; and the source polysilicon 4 in the source polysilicon lead-out region 403 is in contact with the source polysilicon 4 in the device cell region 401.

The frontside process further includes the following steps:

An interlayer film 10, a contact 11, and a front metal layer 12 are formed, and the front metal layer 12 is patterned to form a gate and a source.

A contact 11 is formed on the top of the polysilicon gate 7 of the gate structure in the gate lead-out region 402, and the contact 11 on the top of the polysilicon gate 7 is connected to the gate.

A contact 11 is formed on the top of the source polysilicon 4 in the source polysilicon lead-out region 403 and is connected to the source.

A contact 11 is further formed on the top of the source region 9 and is connected to the source.

The present application is described above in detail via specific embodiments, which do not constitute a limitation to the present application. Without departing from the principle of the present application, those skilled in the art can further make many modifications and improvements, which shall also be construed as the protection scope of the present application.

What is claimed is:

1. A shield gate trench power device, wherein a gate structure of a device cell region comprises:
   a doped epitaxial layer of a first conductivity type formed on a semiconductor substrate, wherein a gate trench is formed in the epitaxial layer;
   a shield dielectric layer formed on the bottom surface and side surface of the gate trench, wherein the shield dielectric layer is formed by stacking a thermal oxide layer and a CVD dielectric layer, such that the thickness of the shield dielectric layer is increased while the uniformity of the thickness of the shield dielectric layer on the sidewall and bottom of the trench is ensured, thereby increasing the breakdown voltage of the shield dielectric layer and lowering a breakdown voltage requirement of the epitaxial layer;
   a gap region formed in a central region of the gate trench, resulting from the shield dielectric layer not fully filling the gate trench, wherein the gap region is filled with source polysilicon;
   a top trench formed on two sides of the source polysilicon by performing anisotropic etching on a partial region of the thermal oxide layer of the shield dielectric layer close to the side surface of the gate trench, wherein the entire top trench is located in the thermal oxide layer, a first side surface of the top trench is an exposed side surface of the gate trench, the shield dielectric layer between a second side surface of the top trench and the source polysilicon serves as an inter-polysilicon dielectric layer, in the width direction of the inter-polysilicon dielectric layer, the inter-polysilicon dielectric layer is a stack structure of the CVD dielectric layer and the thermal oxide layer of a partial thickness, the width of the top trench and the width of the inter-polysilicon dielectric layer are defined by means of photolithography at the same time, and the width of the inter-polysilicon dielectric layer is increased to increase Cgs of the device; and
   a gate dielectric layer formed on the first side surface of the top trench, wherein a polysilicon gate fully filling the top trench is formed in the top trench where the gate dielectric layer is formed;
   the gate dielectric layer is spaced between the polysilicon gate and the first side surface of the top trench, and the inter-polysilicon dielectric layer is spaced between the polysilicon gate and the source polysilicon.

2. The shield gate trench power device according to claim 1, wherein the semiconductor substrate comprises a silicon substrate, and the epitaxial layer is a silicon epitaxial layer.

3. The shield gate trench power device according to claim 2, wherein the CVD dielectric layer is an oxide layer deposited by a CVD process, and the gate dielectric layer is a gate oxide layer.

4. The shield gate trench power device according to claim 3, wherein a working voltage of the shield gate trench power device is greater than or equal to 150 V.

5. The shield gate trench power device according to claim 4, wherein in the shield dielectric layer, the thickness of the thermal oxide layer is 3000 Å-7500 Å; and the thickness of the CVD dielectric layer is 2500 Å-7000 Å.

6. The shield gate trench power device according to claim 1, wherein the shield gate trench power device is a shield gate trench power MOSFET device, and the structure of the device cell region further comprises:

a doped body region of a second conductivity type formed on the surface of the epitaxial layer, wherein the top trench passes through the body region, and the surface of the body region covered by a side surface of the polysilicon gate is used to form a channel; and a heavily doped source region of the first conductivity type formed on the surface of the body region; and wherein the semiconductor substrate has a heavily doped structure of the first conductivity type, and a drain region is formed on the back of the thinned semiconductor substrate.

7. The shield gate trench power device according to claim 6, wherein the shield gate trench power device further comprises a gate lead-out region; the gate lead-out region is located outside the device cell region, the gate lead-out region also comprises the gate structure, the gate structure in the gate lead-out region and the gate structure in the device cell region are formed at the same time, and the polysilicon gate in the gate lead-out region is in contact with the polysilicon gate in the device cell region;

a contact is formed on the top of the polysilicon gate of the gate structure in the gate lead-out region, and the contact on the top of the polysilicon gate is connected to a gate composed of a front metal layer;

the shield gate trench power device further comprises a source polysilicon lead-out region, the gate trench is also formed in the source polysilicon lead-out region, the shield dielectric layer and the source polysilicon are formed in the gate trench of the source polysilicon lead-out region, the top trench, the gate dielectric layer, and the polysilicon gate are not formed in the gate trench of the source polysilicon lead-out region; the source polysilicon in the source polysilicon lead-out region is in contact with the source polysilicon in the device cell region; a contact is formed on the top of the source polysilicon in the source polysilicon lead-out region and is connected to a source composed of the front metal layer; and a contact is further formed on the top of the source region and is connected to the source.

8. The shield gate trench power device according to claim 1, wherein the shield gate trench power device is an N-type device, the first conductivity type is N-type, and the second conductivity type is P-type; or the shield gate trench power device is a P-type device, the first conductivity type is P-type, and the second conductivity type is N-type.

9. A method for manufacturing a shield gate trench power device, wherein a gate structure of a device cell region is formed by means of the following steps:

step 1. providing a semiconductor substrate, wherein a doped epitaxial layer of a first conductivity type is formed on the semiconductor substrate, and a gate trench is formed in the epitaxial layer;

step 2. forming a shield dielectric layer on the bottom surface and side surface of the gate trench;

wherein the shield dielectric layer comprises a thermal oxide layer formed by means of a thermal oxidation process and a CVD dielectric layer formed by means of a CVD deposition process, a stack structure of the thermal oxide layer and the CVD dielectric layer increases the thickness of the shield dielectric layer while ensuring the uniformity of the thickness of the shield dielectric layer on the sidewall and bottom of the gate trench, thereby increasing the breakdown voltage of the shield dielectric layer and lowering a breakdown voltage requirement of the epitaxial layer; and a gap region is formed in a central region of the gate trench, resulting from the shield dielectric layer not fully filling the gate trench;

step 3. performing polysilicon growth and etch-back processes to fill the gap region of the gate trench with source polysilicon;

step 4. performing a photolithography process to open a formation region of a top trench, wherein the formation region of the top trench corresponds to a partial region of the thermal oxide layer of the shield dielectric layer close to the side surface of the gate trench, anisotropic etching is performed on the shield dielectric layer of the opened region to form the top trench, the entire top trench is located in the thermal oxide layer, a first side surface of the top trench is an exposed side surface of the gate trench, the shield dielectric layer between a second side surface of the top trench and the source polysilicon serves as an inter-polysilicon dielectric layer, in the width direction of the inter-polysilicon dielectric layer, the inter-polysilicon dielectric layer is a stack structure of the CVD dielectric layer and the thermal oxide layer of a partial thickness, the width of the top trench and the width of the inter-polysilicon dielectric layer are defined by means of photolithography at the same time, and the width of the inter-polysilicon dielectric layer is increased to increase Cgs of the device; and step 5. forming a gate dielectric layer on the first side surface of the top trench and performing polysilicon growth and etch-back processes to fill the top trench where the gate dielectric layer is formed with polysilicon and form a polysilicon gate, the gate dielectric layer is spaced between the polysilicon gate and the first side surface of the top trench, and the inter-polysilicon dielectric layer is spaced between the polysilicon gate and the source polysilicon.

10. The method for manufacturing a shield gate trench power device according to claim 9, wherein the semiconductor substrate comprises a silicon substrate and the epitaxial layer is a silicon epitaxial layer.

11. The method for manufacturing a shield gate trench power device according to claim 10, wherein the CVD dielectric layer is an oxide layer deposited by a CVD process, and the gate dielectric layer is a gate oxide layer.

12. The method for manufacturing a shield gate trench power device according to claim 11, wherein a working voltage of the shield gate trench power device is greater than or equal to 150 V.

13. The method for manufacturing a shield gate trench power device according to claim 12, wherein in the shield dielectric layer, the thickness of the thermal oxide layer is 3000 Å-7500 Å; and the thickness of the CVD dielectric layer is 2500 Å-7000 Å.

14. The method for manufacturing a shield gate trench power device according to claim 9, wherein the shield gate trench power device is a shield gate trench power MOSFET device, and the method further comprises the following steps of a frontside process:

forming a doped body region of a second conductivity type on the surface of the epitaxial layer, wherein the top trench passes through the body region, and the surface of the body region covered by a side surface of the polysilicon gate is used to form a channel; and forming a heavily doped source region of the first conductivity type on the surface of the body region of the device cell region; and wherein the semiconductor substrate has a heavily doped structure of the first conductivity type, and after the frontside process is completed, the method further comprises the following backside process:

thinning the semiconductor substrate; and forming a drain region by the thinned semiconductor substrate; or performing doping on the back of the thinned semiconductor substrate to form a heavily doped drain region of the first conductivity type.

15. The method for manufacturing a shield gate trench power device according to claim 14, wherein the shield gate trench power device further comprises a gate lead-out region;

the gate lead-out region is located outside the device cell region, the gate lead-out region also comprises the gate structure, the gate structure in the gate lead-out region and the gate structure in the device cell region are formed at the same time, and the polysilicon gate in the gate lead-out region is in contact with the polysilicon gate in the device cell region;

the shield gate trench power device further comprises a source polysilicon lead-out region, the gate trench is also formed in the source polysilicon lead-out region, the shield dielectric layer and the source polysilicon are formed in the gate trench of the source polysilicon lead-out region, the top trench, the gate dielectric layer, and the polysilicon gate are not formed in the gate trench of the source polysilicon lead-out region; the source polysilicon in the source polysilicon lead-out region is in contact with the source polysilicon in the device cell region;

the frontside process further comprises steps of:

forming an interlayer film, a contact, and a front metal layer, and patterning the front metal layer to form a gate and a source;

a contact is formed on the top of the polysilicon gate of the gate structure in the gate lead-out region, and the contact on the top of the polysilicon gate is connected to the gate;

a contact is formed on the top of the source polysilicon in the source polysilicon lead-out region and is connected to the source; and a contact is further formed on the top of the source region and is connected to the source.

* * * * *